United States Patent
Wang et al.

(10) Patent No.: US 12,200,896 B2
(45) Date of Patent: Jan. 14, 2025

(54) AIR-COOLED CARRIER FOR STORAGE MODULES WITH COMPENSATED AIRFLOW TO MAINTAIN COOLING OF MOUNTED COMPONENTS

(71) Applicant: Fulian Precision Electronics (Tianjin) Co., LTD., Tianjin (CN)

(72) Inventors: Pao-Ching Wang, New Taipei (TW); Ke-Cheng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 375 days.

(21) Appl. No.: 17/739,334

(22) Filed: May 9, 2022

(65) Prior Publication Data

US 2022/0369501 A1    Nov. 17, 2022

(30) Foreign Application Priority Data

May 12, 2021    (CN) .......................... 202110517288.X

(51) Int. Cl.
*H05K 7/20* (2006.01)
*G06F 1/18* (2006.01)
*G06F 1/20* (2006.01)

(52) U.S. Cl.
CPC .......... *H05K 7/20145* (2013.01); *G06F 1/181* (2013.01); *G06F 1/20* (2013.01); *H05K 7/20736* (2013.01)

(58) Field of Classification Search
CPC ............ H05K 7/20145; H05K 7/20736; G06F 1/181; G06F 1/20

USPC ....................................................... 361/679.51
See application file for complete search history.

(56) References Cited

U.S. PATENT DOCUMENTS

| | | | |
|---|---|---|---|
| 10,054,993 B2 * | 8/2018 | Yi ....................... | H05K 7/20154 |
| 11,006,543 B2 * | 5/2021 | Huangfu ................. | H05K 5/03 |
| 2014/0144858 A1 * | 5/2014 | Yokosawa ............. | H05K 7/183 211/182 |
| 2020/0344908 A1 * | 10/2020 | Liu .......................... | H01F 7/02 |
| 2021/0410314 A1 * | 12/2021 | Chen .................... | H05K 5/0213 |

FOREIGN PATENT DOCUMENTS

TW        202037256 A        10/2020

* cited by examiner

*Primary Examiner* — Zhengfu J Feng
(74) *Attorney, Agent, or Firm* — ScienBiziP, P.C.

(57) ABSTRACT

An air-cooled carrier of heat-generating electronic components includes a frame, a plate, and baffles. The plate coupled to the frame divides airflow in the frame into two channels. Opposite sides of each channel along a first direction carry inlet and outlet. A pair of baffles is coupled to each channel, each baffle comprises a mounting part, an arc-shaped elastic part, and a blocking part. The mounting part is fixed to the frame and the arc-shaped elastic part. The blocking part is fixed to the arc-shaped elastic part and extends to middle of the airflow cavity in a second direction perpendicular to the first direction. In the absence of a mounted storage component, the elastic part bringing the blocking part to a first position and so blocking air flow from that outlet to that inlet.

5 Claims, 7 Drawing Sheets

AIR-COOLED CARRIER FOR STORAGE MODULES WITH COMPENSATED AIRFLOW TO MAINTAIN COOLING OF MOUNTED COMPONENTS

FIELD

The subject matter herein generally relates to air-cooled carriers and storage modules.

BACKGROUND

A plurality of storage components is installed in a plurality of channels of a chassis of a carrier for computer or other device. When one of a plurality of the storage components is removed from one of the channels, air flow required for cooling the other storage components may be lost, escaping back into the channel from which the storage component is removed.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
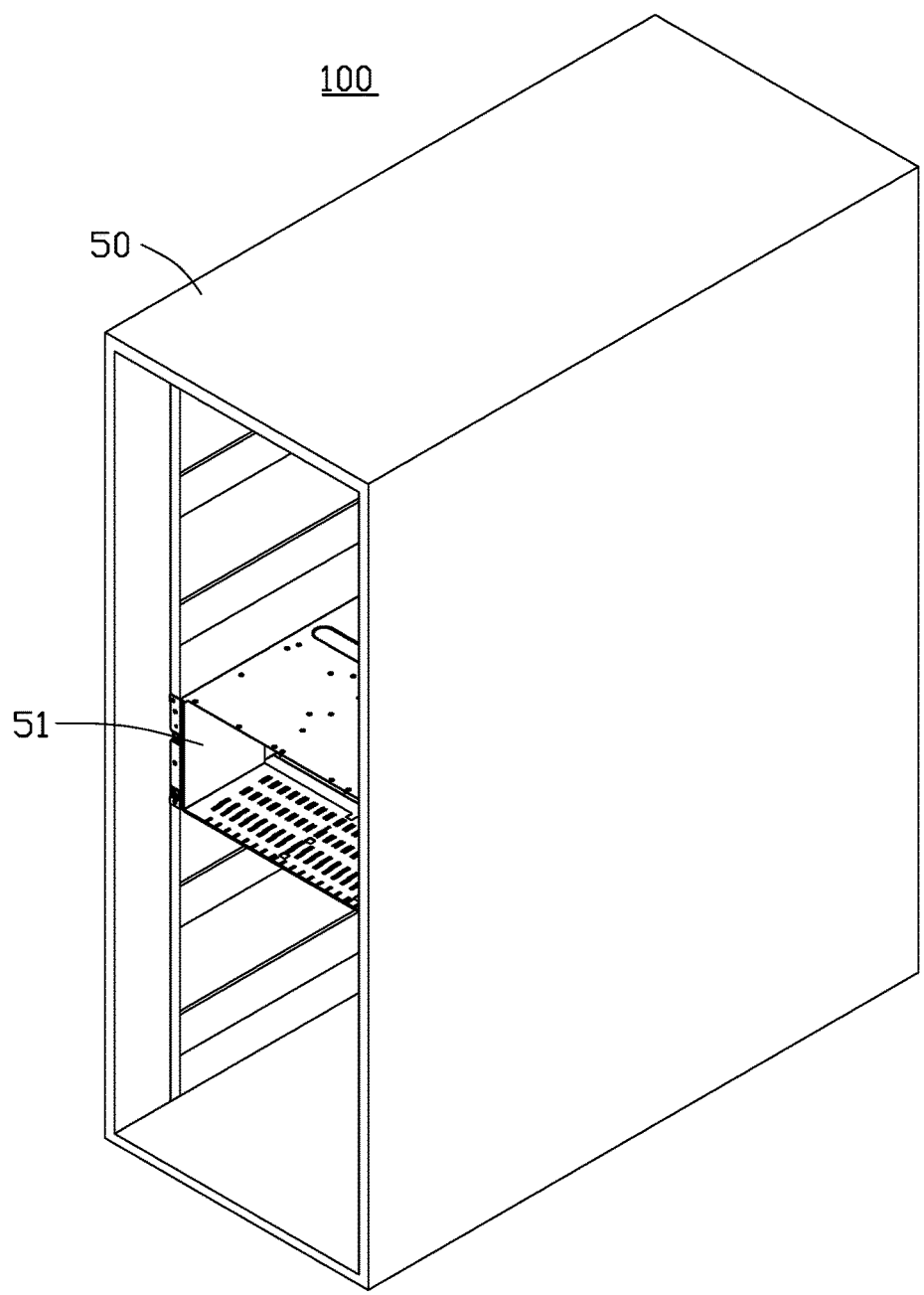
FIG. 1 is an isometric, assembled view of an air-cooled carrier according to an embodiment of the present disclosure, wherein no storage module is mounted in the chassis of the carrier.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
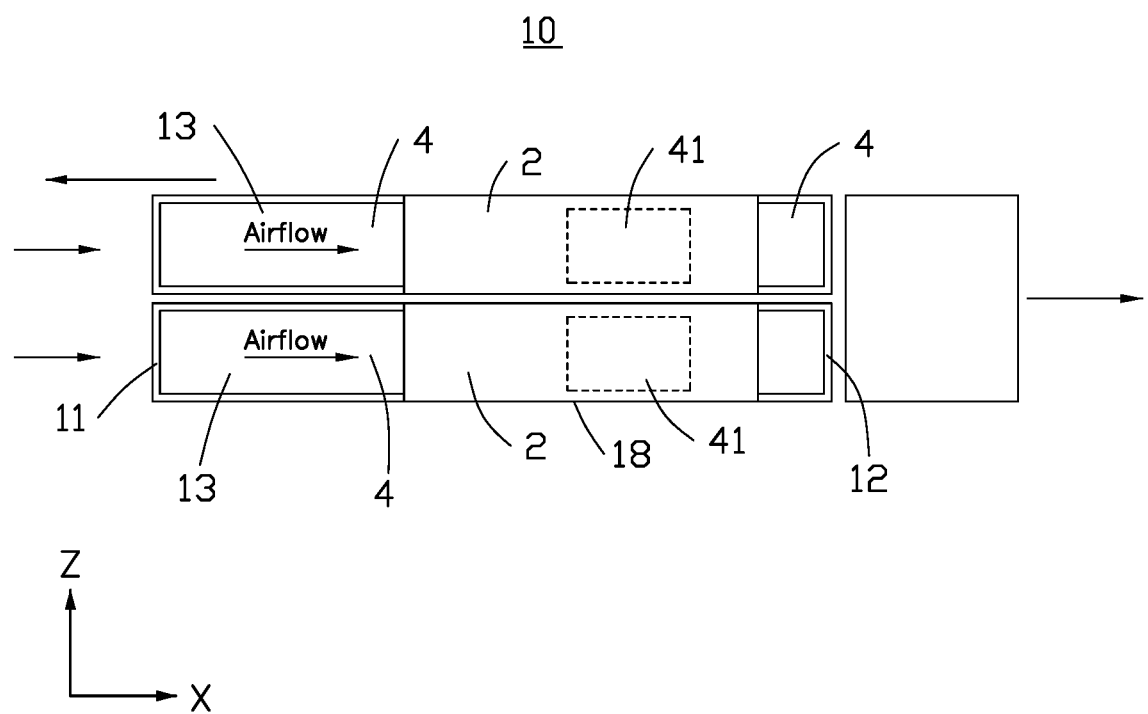
FIG. 2 is a block diagram view of a storage module according to an embodiment of the present disclosure, wherein two storage components are mounted in the carrier.

As shown in FIG. 1 and FIG. 2, a computer 100 of an embodiment includes a storage module 10 and a chassis 50. A mounting cavity 51 is defined on the chassis 50, and the storage module 10 is connected to the chassis 50 in the mounting cavity 51.

Figure 3:
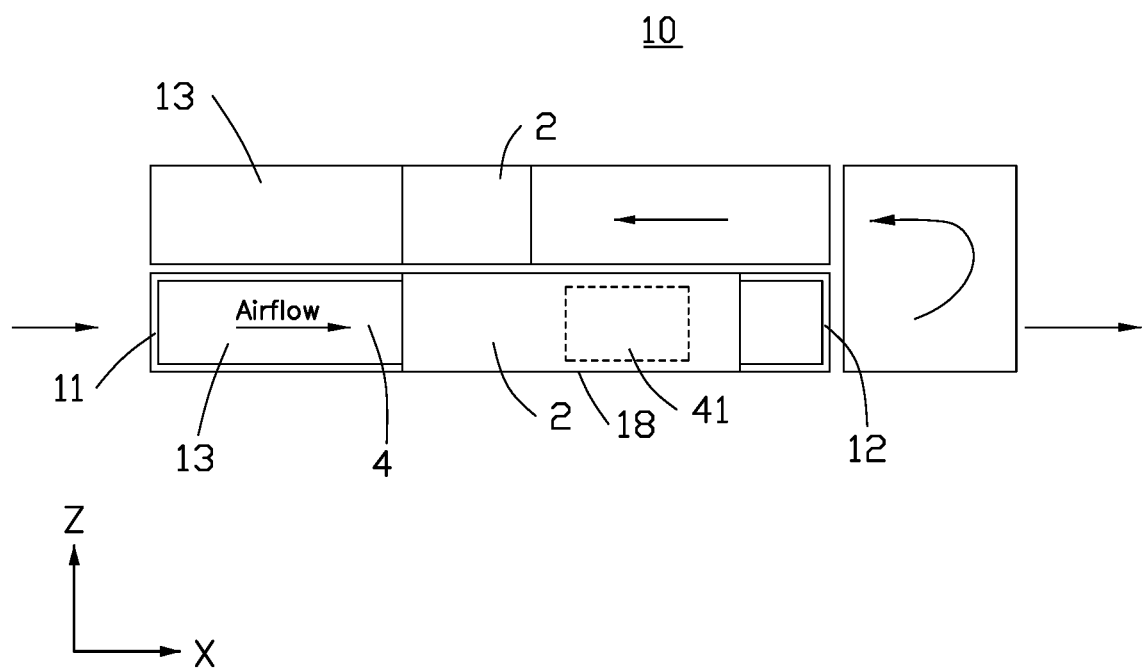
FIG. 3 is a block diagram view of a storage module according to an embodiment of the present disclosure, wherein only one storage component is mounted in the carrier.
Figure 4:
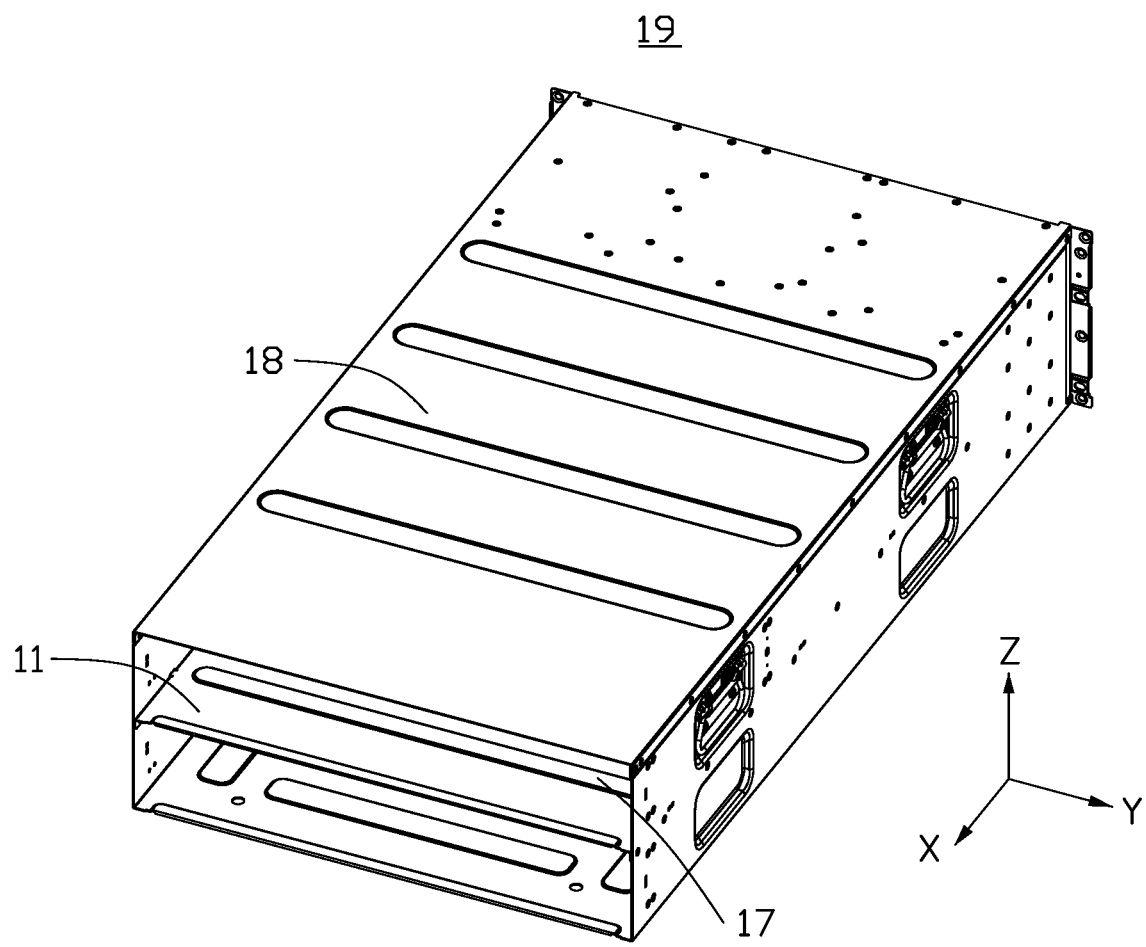
FIG. 4 is an isometric view of a carrier according to an embodiment of the present disclosure.

As shown in FIG. 2 to FIG. 4, the storage module 10 includes a carrier 19 and a plurality of storage components 4. The carrier 19 includes a frame 18 and a plate 17. An airflow cavity is defined in the frame. The plate 17 set in the airflow cavity. Two channels 13 are formed in the frame 18 by the plate 17. The two channels 13 are extended along a first direction X, and arranged side by side in the second direction Y. An inlet 11 and an outlet 12 are defined in opposite sides of the channel 13 along the first direction X. The second direction Y is perpendicular to the first direction X. A pair of baffles 2 is mounted in one of the two channels 13, and the other pair of baffles 2 is mounted in the other of the two channels 13.

In some embodiments, the carrier 19 includes only two baffles 2. Each baffle 2 of each pair is located in one of the two channels 13. The blocking part 21 of the baffle 2 restricts air flow in the channel 13.

Figure 5:
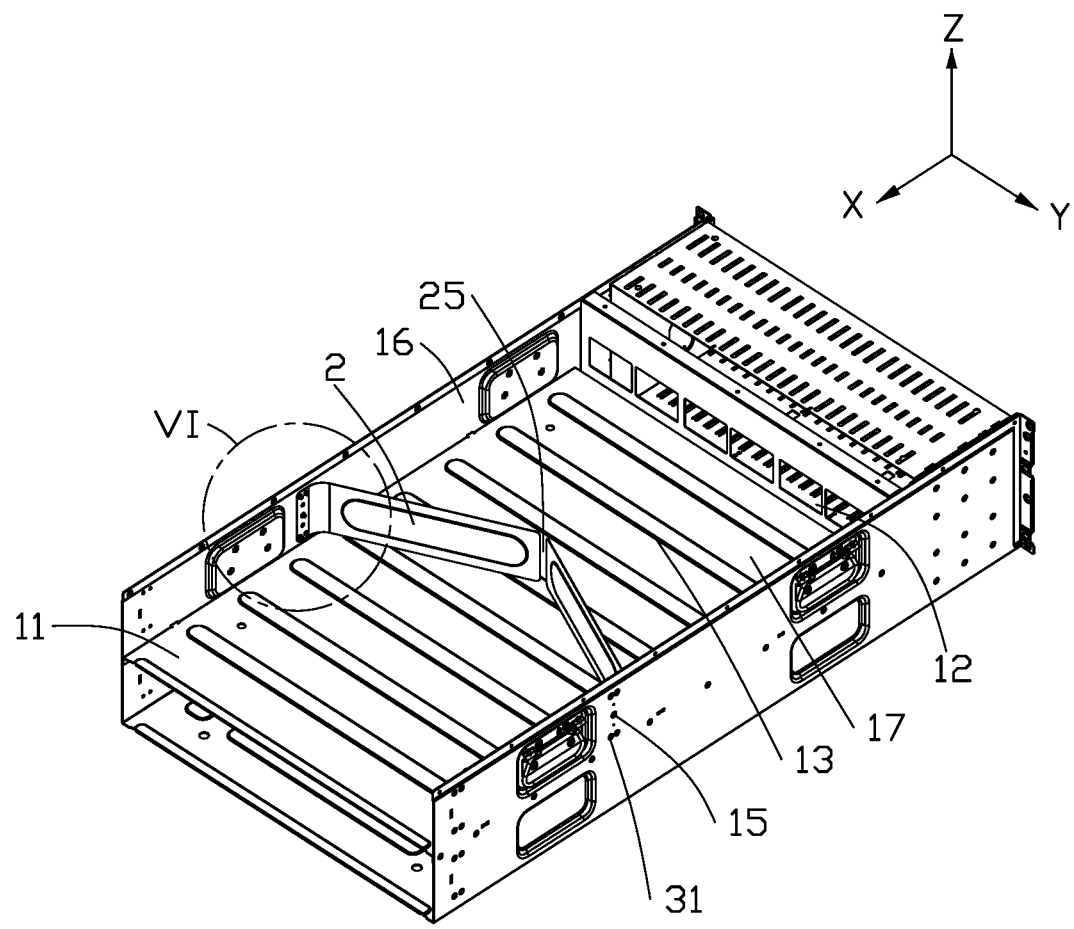
FIG. 5 is an isometric view of the carrier shown in FIG. 4, wherein a top plate of a frame is removed.
Figure 6:
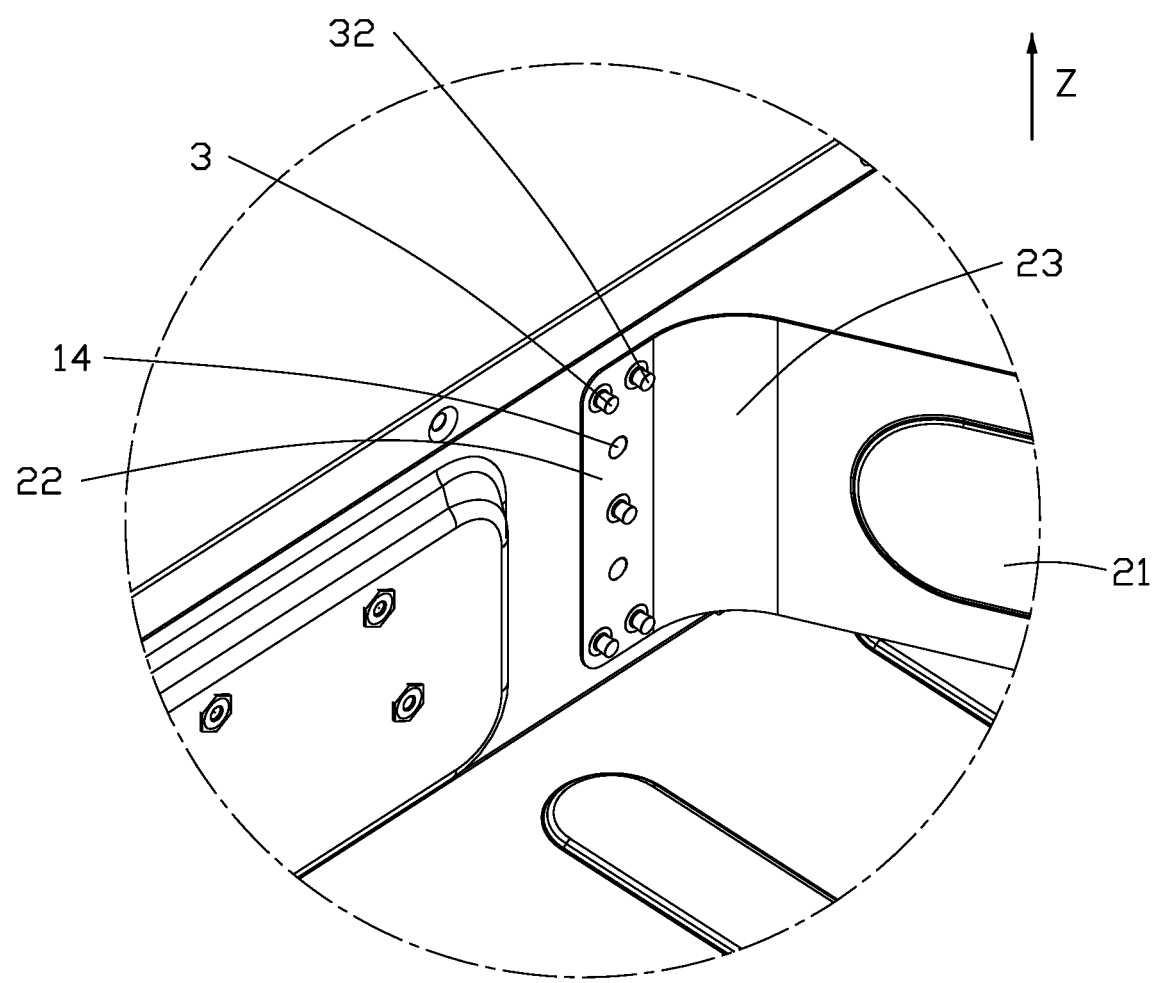
FIG. 6. shows encircled position VI in FIG. 5.

As shown in FIG. 5 and FIG. 6, the pair of the baffles 2 is disposed near opposite sides of the frame 18 along a third direction Z. The third direction Z is perpendicular to the first direction X and the second direction Y. Each of the four baffles 2 includes a mounting part 22, an arc-shaped elastic part 23, and a blocking part 21. A plurality of first holes 14 is defined in the mounting part 22. The carrier 19 further includes fasteners such as rivets. A plurality of second holes 15 is defined in the frame. Each fastener includes a rivet 3. The rivet 3 includes a first fastening end 31 and a second fastening end 32. The first fastening end 31 is arranged on one side of the frame 18 away from the mounting part 22. The second fastening end 32 is arranged on one side of the mounting part 22 away from the frame. The rivet 3 brings the mounting part 22 into contact with the inner wall 16, and the mounting part 22 is fixedly connected with the frame.

In some other embodiments, each fastener can be a bolt and a nut. The bolt passes through one of the first holes 14 and one of the second holes 15, and connects to the nut. The cooperation of the bolt and the nut makes the mounting part 22 touch the inner wall 16, and the mounting part 22 is thus fixedly connected with the frame.

The blocking part 21 extends from one side of the frame 18 to middle of the mounting cavity 51. One end of the arc-shaped elastic part 23 connects to the mounting part 22, and the other end connects to the blocking part 21. The arc-shaped elastic part 23 bears on the blocking part 21, driving it to a first position substantially parallel to the third direction Z. When the blocking part 21 is in the first position, an end of the blocking part 21 away from the arc-shaped elastic part 23 is close to the inlet 11. The elastic portion allows the blocking portion to deform more easily in the direction of the outlet 12 than in the direction of the inlet 11. A first gap 25 is formed between the two blocking parts 21 in the first position of the pair of the baffles 2. The first gap 25 is so small that it will be difficult for air to pass through the first gap 25 from the outlet 12 to the inlet 11.

Each of the storage components 4 includes a shell, a fan 41 and a storage unit. The fan 41 and the storage unit are located in the shell. Each of the storage components 4 is set in each of the channels 13 to drive the air to flow from the inlet 11 to the outlet 12. When the storage component 4 is set in the channel 13, the end of the blocking part 21 away from the arc-shaped elastic part 23 acts on the shell of the storage component 4, and the blocking part 21 is in a second position. When the blocking part 21 is in the second position, the end of the blocking part 21 away from the arc-shaped elastic part 23 is close to the outlet 12. The blocking part 21 blocks air flow between the storage component 4 and the inner face of the frame. One end of the arc-shaped elastic part 23 away from the outlet 12 is connected to the mounting part 22, and one end of the arc-shaped elastic part 23 close to the outlet 12 is connected to the blocking part 21. The elastic portion therefore allows the blocking portion to deform more easily in the direction of the outlet 12 than in the direction of the inlet 11.

In some embodiments, any number of baffles 2 may be disposed within frame 18 for blocking air flow in the channel 13.

In some embodiments, when the storage component 4 is set in the channel 13, the blocking part 21 is in the first position. The elastic portion is more easily deformed in the direction of the outlet 12 than in the direction of the inlet 11. When the storage component 4 drives the air to flow in the channel 13, the air acts on the blocking part 21 to force the blocking part 21 into a third position. A second gap is formed between the two blocking parts 21 in the third position, and air can pass through the second gap.

The arc-shaped elastic part 23 can be an arc-shaped sheet. When the arc-shaped sheet is forced straight, the arc-shaped sheet attempts to restore into an arcing shape. The arc-shaped sheet is connected to an end of the mounting part 22 close to the outlet 12, so that the arc-shaped sheet allows the blocking portion to deform more easily in the direction of the outlet 12 than in the direction of the inlet 11.

In some embodiments, the mounting part 22, the arc-shaped elastic part 23, and the blocking part 21 are integrally formed for high strength. The baffle 2 is made of stainless steel, having the advantages of good elasticity and toughness, and resilient against plastic deformation, so that the blocking part 21 can rebound to the first position from the second position. In other embodiments, the baffle 2 can also be made of other metals, so that the baffle 2 is not easily worn out, while maintaining the elasticity of the arc-shaped elastic part 23. Metal is easy to process and low cost, which can reduce the production cost of the elastic flap. It is also understandable that the baffle 2 can also be made of other materials, as long as the baffle 2 has sufficient toughness, resilience, and strength, so that the arc-shaped elastic part 23 can provide elastic force and is not easily broken when the baffle 2 is impacted.

Figure 7:
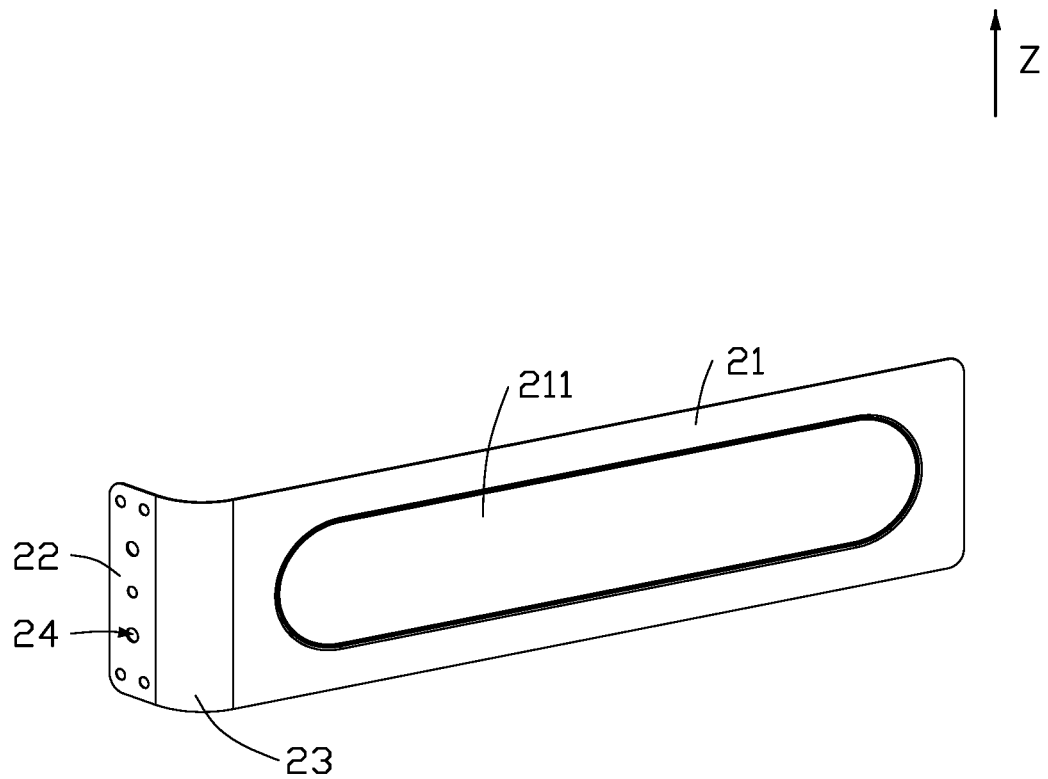
FIG. 7 is an isometric view of a baffle according to an embodiment of the present disclosure.

As shown in FIG. 7, a groove 211 is defined on the blocking part 21. When the blocking part 21 is in the first position, the groove 211 is facing the outlet 12. When the outlet 12 permits airflow, the airflow rushes to the groove 211, the airflow pressure in the groove 211 increases a tendency of the blocking part 21 to move towards the inlet 11. The elastic portion allows the blocking portion to deform more easily in the direction of the outlet 12 than in the direction of the inlet 11, so that the blocking part 21 is stably maintained in the first position.

The blocking part 21 forms a bulge on the side opposite to the groove 211. In some embodiments, when the storage component 4 is set in the channel 13, the bulge can act on the storage unit instead of the end of the blocking part 21.

As shown in FIG. 2 and FIG. 3, when the two storage components 4 are mounted in the frame, each of the two storage components 4 is arranged in each of the channels 13. The fan 41 forces the airflow in the channel 13 from the inlet 11 to the outlet 12. When one of the two storage components 4 is removed from one of the two channels 13, the other storage component 4 is still working. The airflow from one of the two channels 13 with the storage component 4 tends to flow in from the outlet 12 of the other channel 13. The blocking part 21 of one of the two channels 13 without the fan 41 is in the first position to block the airflow. Thus one of the two channels 13 accommodating the storage component 4 always get a cooling airflow from the inlet 11.

In some embodiments, only one channel 13 is defined in the carrier 19. When two carriers 19 are arranged side by side along the third direction Z, the air flow from one carrier 19 with a storage component 4 mounted can be blocked by the blocking part 21 of the other carrier 19.

In some embodiments, the carrier 19 includes only one baffle 2. The baffle 2 is located in the channel 13. The blocking part 21 of the baffle 2 can restrict air flow in the channel 13.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims.

What is claimed is:

1. A carrier comprising:
   a frame comprising a channel;
   an inlet and an outlet are defined on opposite sides of the channel along a first direction;
   a pair of baffles located in the channel between the inlet and the outlet, wherein
   the pair of baffles are respectively coupled to the channel on opposite sides of the channel along a second direction, the second direction is perpendicular to the first direction;
   each of the pair of baffles comprises:
      a mounting part coupled to the frame;
      an arc-shaped elastic part coupled to the mounting part;
      a blocking part coupled to the arc-shaped elastic part;
      the mounting part, the arc-shaped elastic part, and the blocking part are integrally formed into a sheet;
      a groove is defined on the blocking part, when the blocking part is in a first position, the groove is facing the outlet;

the blocking part forms a bulge on the side opposite to the groove;

a first gap is formed between two blocking parts of the pair of baffles in the first position;

the carrier further comprises a plurality of rivets, a plurality of first holes is defined in the mounting part, a plurality of second holes is defined in the frame, each of the plurality of rivets comprises a first fastening end and a second fastening end, the first fastening end is arranged on a side of the frame away from the mounting part, the second fastening end is arranged on a side of the mounting part away from the frame.

2. The carrier of claim 1, wherein:

when the blocking part is in the second direction, a dihedral angle is formed between the blocking part and an inner wall of the frame, the dihedral angle is an acute angle.

3. The carrier of claim 1, further comprising a plate, wherein:

a number of the channel in the frame is two;

an airflow cavity is defined in the frame;

a plate is coupled to the frame for dividing airflows into the two channels.

4. The carrier of claim 1, wherein:

one end of the arc-shaped elastic part away from the outlet is coupled to the mounting part, and one end of the arc-shaped elastic part close to the outlet is coupled to the blocking part.

5. A storage module, comprising:

a storage component comprises a fan;

a frame, comprising a channel;

an inlet and an outlet are defined on opposite sides of the channel along a first direction;

a pair of baffles located in the channel between the inlet and the outlet, wherein the pair of baffles are respectively coupled to the channel on opposite sides of the channel along a second direction, the second direction is perpendicular to the first direction;

each of the pair of baffles comprises:

a mounting part coupled to the frame;

an arc-shaped elastic part coupled to the mounting part;

a blocking part coupled to the arc-shaped elastic part;

when the blocking part is forced to a second position by the storage component, the arc-shaped elastic part moves the blocking part to a first position for blocking air flow from the outlet to the inlet;

the mounting part, the arc-shaped elastic part, and the blocking part are integrally formed into a sheet;

a groove is defined on the blocking part, when the blocking part is in a first position, the groove is facing the outlet;

the blocking part forms a bulge on the side opposite to the groove;

a first gap is formed between two blocking parts of the pair of baffles in the first position;

the carrier further comprises a plurality of rivets, a plurality of first holes is defined in the mounting part, a plurality of second holes is defined in the frame, each of the plurality of rivets comprises a first fastening end and a second fastening end, the first fastening end is arranged on a side of the frame away from the mounting part, the second fastening end is arranged on a side of the mounting part away from the frame.

* * * * *